United States Patent
Silverman et al.

(10) Patent No.: US 7,034,320 B2
(45) Date of Patent: Apr. 25, 2006

(54) DUAL HEMISPHERICAL COLLECTORS

(75) Inventors: Peter J. Silverman, Palo Alto, CA (US); Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/394,412

(22) Filed: Mar. 20, 2003

(65) Prior Publication Data

US 2004/0183031 A1   Sep. 23, 2004

(51) Int. Cl.
*G03F 7/207*   (2006.01)

(52) U.S. Cl. .............................. 250/492.2; 250/504 R; 359/858; 359/351

(58) Field of Classification Search .............. 250/492.2
See application file for complete search history.

(56) References Cited

U.S. PATENT DOCUMENTS

| | | | |
|---|---|---|---|
| 4,916,485 A | 4/1990 | Loth et al. | |
| 5,037,191 A * | 8/1991 | Cheng | ......................... 359/858 |
| 5,408,363 A * | 4/1995 | Kano | ......................... 359/869 |
| 5,613,767 A | 3/1997 | Hamanaka et al. | |
| 5,967,647 A | 10/1999 | Eichler | |
| 6,064,072 A | 5/2000 | Partlo et al. | |
| 6,120,166 A | 9/2000 | Price | |
| 6,195,201 B1 * | 2/2001 | Koch et al. | .................. 359/366 |
| 6,639,652 B1 | 10/2003 | Mori et al. | |
| 6,665,051 B1 * | 12/2003 | Komatsuda | ................... 355/67 |
| 6,690,764 B1 * | 2/2004 | Kondo | ....................... 378/119 |
| 2002/0097505 A1 * | 7/2002 | DeLong | ....................... 359/726 |

FOREIGN PATENT DOCUMENTS

| | | |
|---|---|---|
| EP | 0626621 | 11/1994 |
| JP | 2000-353418 | 12/2000 |
| WO | 0107939 | 2/2001 |

OTHER PUBLICATIONS

Office Action mailed Oct. 29, 2004—Taiwan Patent Application No. 92135850 (9 pgs.).

* cited by examiner

*Primary Examiner*—Nikita Wells
*Assistant Examiner*—Phillip A. Johnston
(74) *Attorney, Agent, or Firm*—Fish & Richardson P.C.

(57) ABSTRACT

A system and method for collecting radiation, which may be used in a lithography illumination system. The system comprises a first surface shaped to reflect radiation in a first hemisphere of a source to illuminate in a second hemisphere of the source; and a second surface shaped to reflect radiation in the second hemisphere of the source to an output plane.

40 Claims, 6 Drawing Sheets

FIG. 3

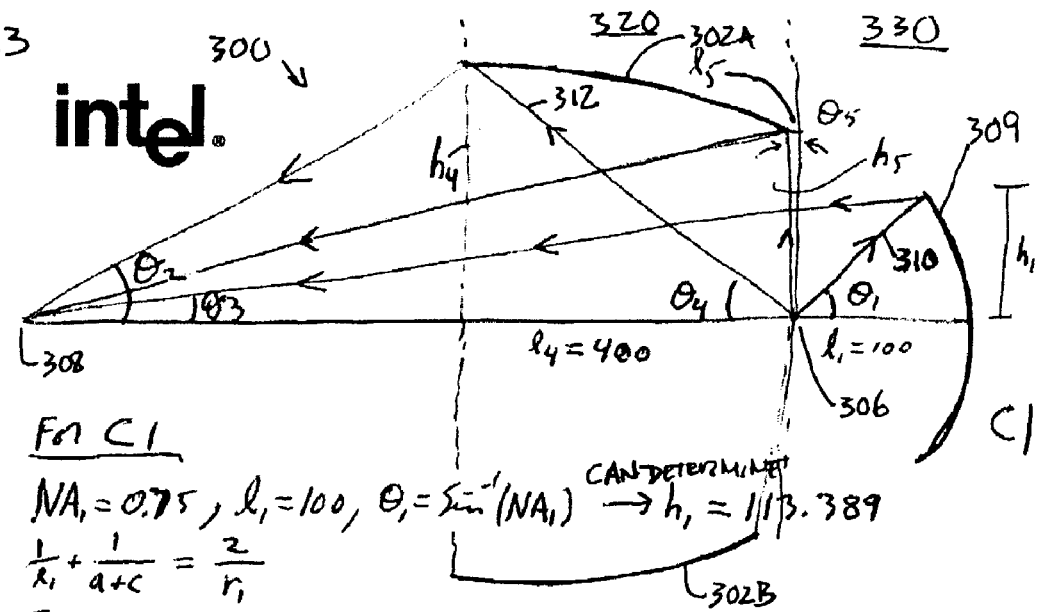

For C1

$NA_1 = 0.75$, $\ell_1 = 100$, $\theta_1 = \sin^{-1}(NA_1)$ CAN DETERMINE → $h_1 = 113.389$ $\dfrac{1}{\ell_1} + \dfrac{1}{a+c} = \dfrac{2}{r_1}$ For C2

Solve $(2c-\ell_4)\tan[\sin^{-1}(NA_2)] = \dfrac{b}{a}\sqrt{a-c+\ell_4}\sqrt{2a-a+c-\ell_4}$ $c^2 = a^2 - b^2$, and $2\sqrt{c^2+\ell^2} = \sqrt{h_4^2+(2c-\ell_4)^2} + \sqrt{h_4^2+\ell_4^2}$ With $\ell_4 = 400$, $NA_2 = \dfrac{0.25}{4} = 0.0625$, $\theta_4 \to h_4$

| $\theta_4$ | a | b | c | $-k = \dfrac{c}{a}$ | $r_2$ | $h_1 = \dfrac{a-c}{\ell_1} h_1$ | |
|---|---|---|---|---|---|---|---|
| 25° | 1712.86 | 283.312 | 1689.27 | 0.986226 | 46.8607 | 23.5929 | 194.289 |
| 30° | 2078.46 | 377.408 | 2043.91 | 0.983376 | 68.5298 | 34.5521 | 195.263 |

Rem: $z = a\left(1-\sqrt{1-\dfrac{x^2}{b^2}}\right)$, $x = \dfrac{b}{a}\sqrt{z}\sqrt{2a-z}$

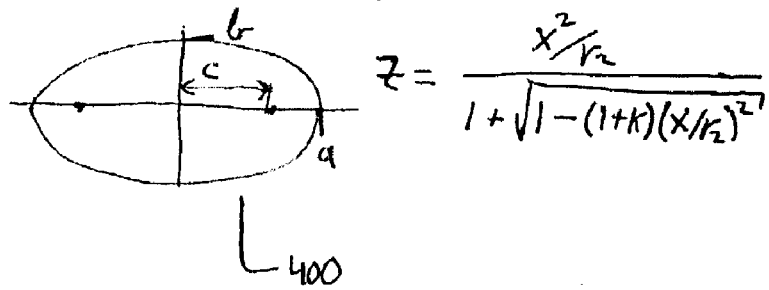

$z = \dfrac{x^2/r_2}{1+\sqrt{1-(1+k)(x/r_2)^2}}$

FIG. 4

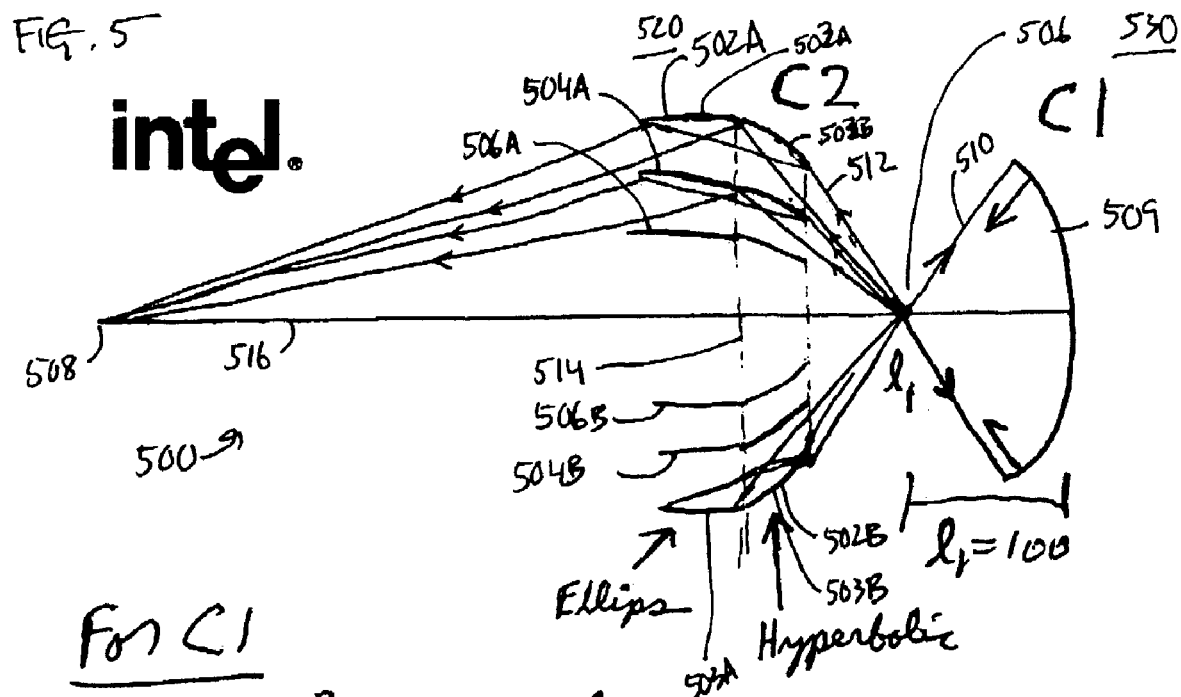

DUAL HEMISPHERICAL COLLECTORS

BACKGROUND

A microchip manufacturing process may deposit various material layers on a wafer and a photosensitive film or photoresist on the deposited layers. The process may use lithography to transmit light through transmissive optics or reflect light from reflective optics and a reticle or patterned mask onto the photoresist, which transfers a patterned image onto the photoresist. A process may remove portions of the photoresist that are exposed to light. A process may etch portions of the wafer which are not protected by the remaining photoresist. Some of these actions may be repeated.

Extreme ultraviolet (EUV) is one form of lithography. A EUV lithography tool may be used to print a pattern on a photoresist with dimensions that are smaller than dimensions achieved by other lithography tools.

BRIEF DESCRIPTION OF THE DRAWINGS

FIG. 3 is a cross-sectional view of a dual hemispherical collector system, which may be used in a lithography illumination system.

FIG. 4 illustrates a table of values associated with FIG. 3.

FIG. 5 is a cross-sectional view of another embodiment of a dual hemispherical collector system, which may be used in a lithography illumination system.

DETAILED DESCRIPTION

Dual hemispherical collectors are described herein with lithography systems, but the dual hemispherical collectors may be used with other light sources for car headlights, movie/video/slide projectors and other applications outside of lithography.

EUV Lithography

Figure 1:
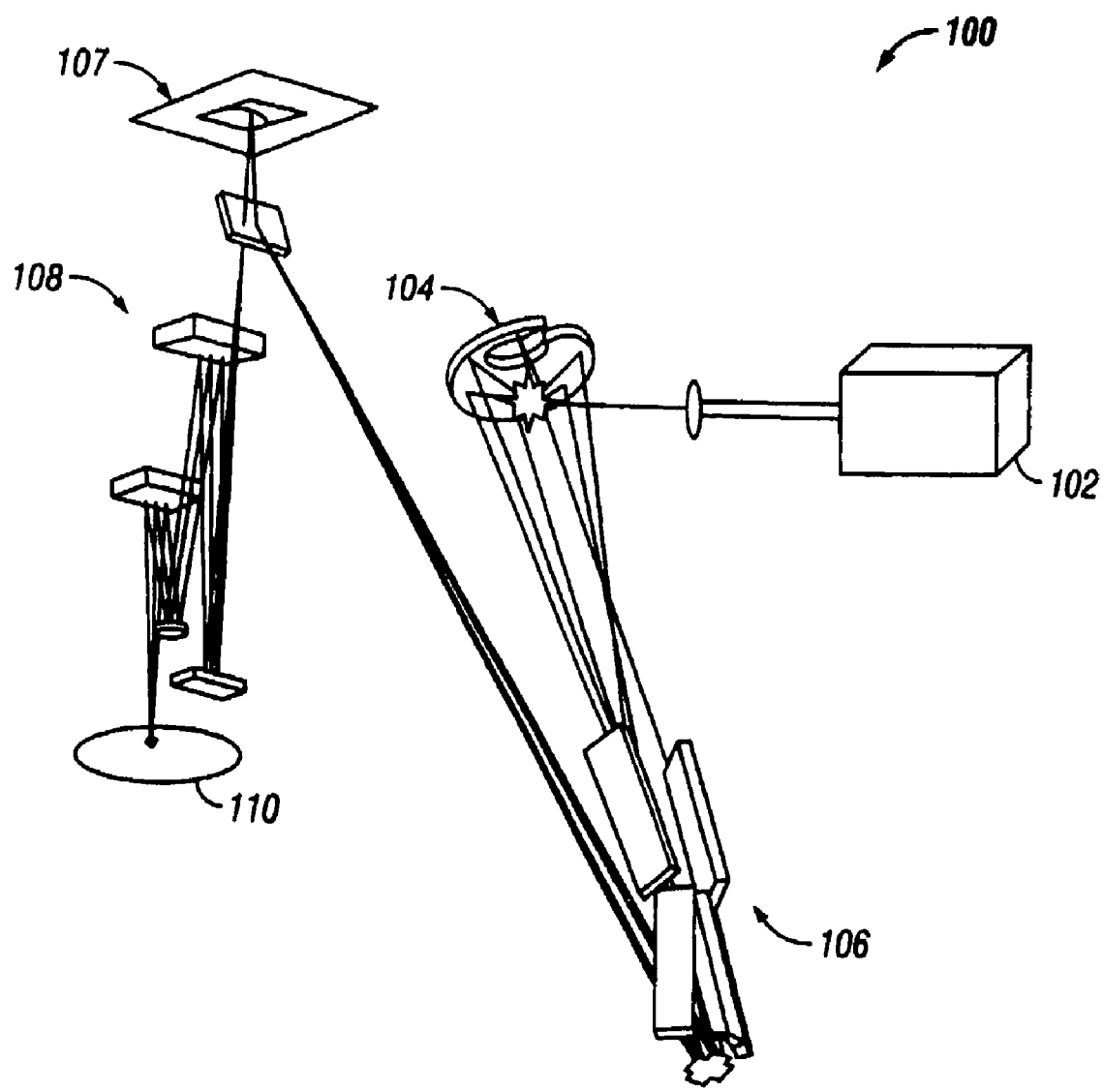
FIG. 1 illustrates one embodiment of an Extreme Ultraviolet (EUV) lithography tool.

FIG. 1 illustrates one embodiment of an Extreme Ultraviolet (EUV) lithography tool 100, which may also be called a "lithographic exposure system" or a "EUV scanner." The lithography tool 100 may include a laser 102, a laser produced plasma (LPP) source 104, a plurality of condenser optics 106, a reflective reticle 107 with a pattern, and a plurality of reflective reduction optics 108.

Figure 2:
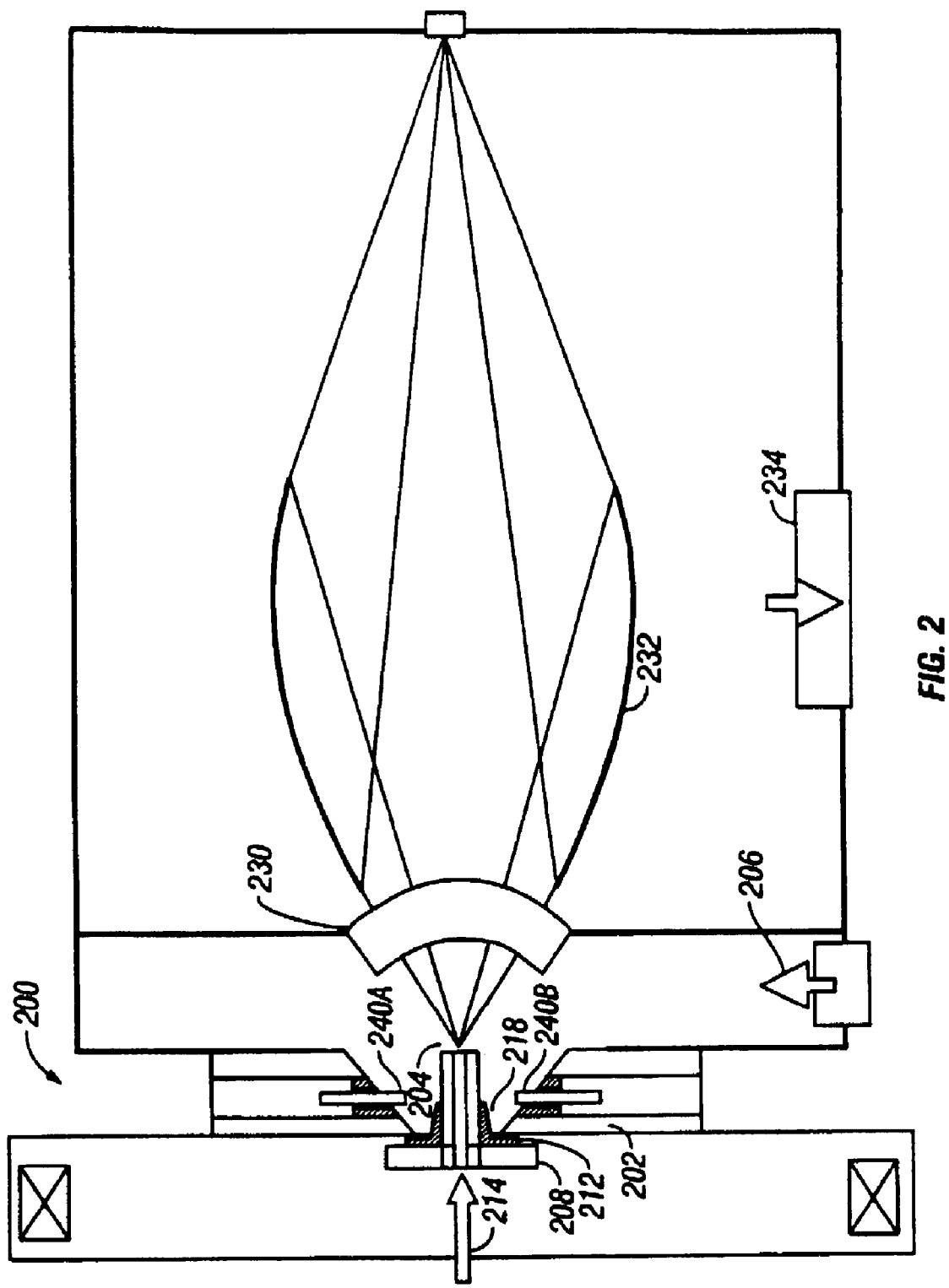
FIG. 2 is a cross-sectional side view of an apparatus which may be used in a Dense Plasma Focus (DPF) electric discharge source.

Other embodiments of the EUV lithography tool 100 may include other components instead of or in addition to the components shown in FIG. 1. For example, instead of a laser produced plasma source 104, the lithography tool 100 may have an electric discharge EUV source 200, as shown in FIG. 2.

The EUV lithography tool 100 may create plasma by using a laser-produced plasma (LPP) source 104 or an electric discharge source 200. A laser-produced plasma (LPP) source 104 produces plasma by focusing a laser 102 onto a gas, liquid, or filament jet of a material or materials, such as Xenon.

An electric discharge source produces plasma by pulsing a current discharge (kAs) (like a powerful arc welder) through a gas, such as Xenon. The plasma emits visible and EUV radiation. Excitation of the Xenon molecules causes the electrons to transition between their shells to produce EUV photon radiation.

The EUV source 104 may produce radiation (photons) with a very short wavelength, such as about 13 nanometers. In other embodiments, the photons may have other wavelengths.

As an example, it may be desirable for the EUV lithography tool 100 to deliver about 50–120 watts of "clean" power to projection optics for a throughput of 80 wafers per hour.

Single Hemisphere Radiation Collection

FIG. 2 illustrates an example of radiation collectors 232 in a single hemisphere. FIG. 2 is a cross-sectional side view of an apparatus 200 which may be used in a Dense Plasma Focus (DPF) electric discharge source. The apparatus 200 includes an anode 208, cathode 202 and insulator 212. The apparatus 200 may be used with a buffer gas 206, such as Helium, a source gas 214, such as Xenon, a foil trap 230, a grazing incidence collector 232 and a pump 234. The anode 208 may be coupled to a high voltage source 216, and the cathode 202 may be grounded.

Extreme ultraviolet (EUV) light sources, particularly laser produced plasma EUV sources, may have a finite power output that is radiated into a large solid angle of up to about 4Π. Laser plasma sources tend to be very small, e.g., about 300 microns in diameter. Due to their small size, a laser plasma source may be modeled as a quasi-point source.

The ability to collect the large solid angle light has been limited by several factors, including mirror fabrication, coating requirements, and the large solid angle itself. Currently, near-normal incidence collectors or grazing incidence collectors try to resolve these challenges to collect light. But the collectors are only in a single hemisphere, as shown in FIGS. 1 and 2.

Dual Hemisphere Radiation Collection

The above challenges may be addressed by using collectors in both hemispheres (e.g., 320 and 330 in FIG. 3) around the radiation source/object (e.g., 306), as described with reference to FIGS. 3–7. Dual hemisphere radiation collectors may be implemented with a laser produced plasma (LPP) source 104 of FIG. 1 or any other light source that radiates light into a large solid angle up to about 4Π.

FIG. 3 is a cross-sectional view of a dual hemispherical collector system 300, which may be used in a lithography illumination system, such as the system 100 of FIG. 1. A radiation source 306 in FIG. 3 emits forward radiation 312 in one hemisphere 320 and backward radiation 310 in another hemisphere 330. The backward radiation 310 may be reflected by a first collector (C1) 309 (also called a "surface," "mirror" or "condenser") at near normal incidence, i.e., almost perpendicular, e.g., 75–89 degrees. The first collector 309 may have a spherical or aspherical shape, i.e., elliptic or other conics.

A second collector 302 may have a grazing incidence, e.g., less then about 60 degrees, and may reflect forward directed radiation 312 from the source 306. Side 302B is a continuous bottom part of the second collector 302A. The second collector 302 may have an aspherical shape, e.g., elliptic.

Light from both hemispheres 320 and 330 around the source 306 may be focused with a single reflection by the collectors C1, C2 309, 302 towards an output point or x-z plane 308 with a "z" axis into the page and an "x" horizontal axis. The collectors 302, 309 may be shaped, sized and positioned to reflect light from the source 306 to the output point or plane 308. Examples of values for FIG. 3 may be expressed as follows. For the first collector (C1) 309:

$NA_1$ (Numerical Aperture)=0.75, $L_1$=100 mm, $\theta_1 = \sin^{-1}(NA_1) \rightarrow H_1 = 113.389$ mm.

$1/L_1 + 1/(a+c) = 2/r_1$ where "a" and "c" are variables to solve for an elliptic collector in FIGS. 3 and 4. "a" is a major axis of the ellipse 400 in FIG. 4. "b" is a minor axis of the ellipse 400. "c" is a focal point of the ellipse 400 from the origin. $r_1$ is the radius of curvature of the aspherical collector C1 309. $r_2$ is the radius of curvature of the ellipse 400 at point "a" in FIG. 4. If $L_1$, "a" and "c" are known, then the equation above may be solved for $r_1$.

For the second collector (C2) 302:

$(2c - L_4)\tan[\sin^{-1}(NA_2)] =$ $(b/a)(\text{sqr rt of } (a-c+L_4))(\text{sqr rt of } (2a-a+c-L_4));$ $c^2 = a^2 - b^2$ and $2(\text{sqr rt of } (c^2+b^2)) =$ $(\text{sqr rt of } (H_4^2 + (2c-L_4)^2)) + (\text{sqr rt of } (H_4^2 + L_4))$ with $L_4 = 400$, $NA_2 = 0.25/4 = 0.0625$, $\theta_4 \rightarrow H_4$ FIG. 4 illustrates a table of values for $\theta_4$ and a, b, c, c/a, $r_2$, $f_1 = a-c$ and $r_1$. FIG. 4 also illustrates equations for an ellipse 400:

$z = a(1 - \text{sqr rt of } (1 - x^2/b^2))$ $x = (b/a)(\text{sqr rt of } z)(\text{sqr rt of } (2a-z))$ $z = (x^2/r_2)/(1 + \text{sqr rt of } (1 - (1+k)(x/r_2)^2))$ FIG. 5 is a cross-sectional side view of another embodiment of a dual hemispherical collector system 500, which may be used in a lithography illumination system. In FIG. 5, a light source 506 generates light 510 backward in a first hemisphere 530 to a first collector (C1) 509 (also called "surface," "mirror" or "condenser") and generates light 512 forward to a set of second collectors (C2) 502, 504, 506.

The first collector 509 may have a spherical or aspherical shape, i.e., elliptic or other conics as well. The first collector 509 focuses light 510 back through a region around the source 506, and the light undergoes reflections from the set of second collectors (C2) 502, 504, 506. Thus, light 510 from the backward direction undergoes reflections from a near normal incidence collector 509 and then grazing incidence collectors 502, 504, 506.

For the first collector (C1) 509:

$1/L_1 + 1/L_2 = 2/r_1 \rightarrow r = L_1$

FIG. 5 also shows the cross-sectional tops 502A, 504A, 506A and bottoms 502B, 504B, 506B of the set of mirrors or grazing incidence collectors 502, 504, 506. The collectors 502, 504, 506 may form a rotation about the optic axis 516. From point 508 looking back at the source 506, the collectors 502, 504, 506 may appear to be three concentric rings (having the same center). The collectors 502, 504, 506 may be symmetric. The collectors 502, 504, 506 may be held together by one or more spokes 514.

Each collector 502, 504, 506 may be a "Wolter" collector, which may be known to those of ordinary skill in the art. For example, the collector 502 may have a first part 503B closer to the source 506 that is generally hyperbolic in shape and a second part 503A farther from the source 506 that is generally elliptic in shape. The collectors 502, 504, 506 collect and reflect forward directed radiation 512 to a point or plane 508.

A Wolter collector includes two conic mirror segments 503A, 503B used to form a grazing incidence imaging optic. The total reflectance loss for small and similar angles of incidence on the two mirrors may be approximately equivalent to the loss from a single larger reflection angle design.

Figure 6:
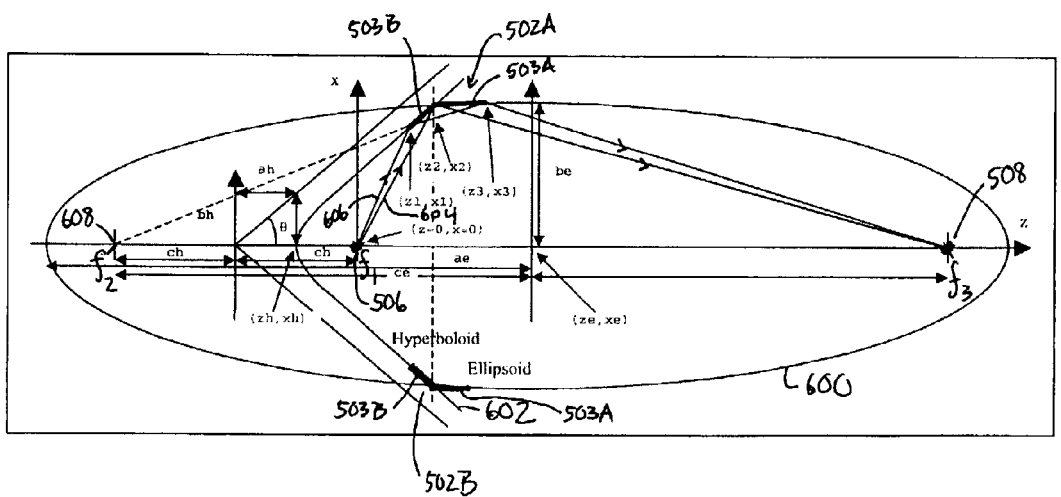
FIG. 6 illustrates an example of a hyperbola and ellipse for a shape of the second collector in FIG. 5.

FIG. 6 illustrates an example of a hyperbola 602 and ellipse 600 for modeling a shape of the Wolter collector 502. The hyperbola 602 may have a real focus (focal point) at f1 and a virtual focus at f2. The source 506 in FIG. 5 may be positioned at the real focus f1 of the hyperbola 602. The ellipse 600 may have a first focus at f2 and a second focus at f3. Thus, the first focus of the ellipse 600 is at the virtual or second focus f2 of the hyperbola 602. The output point or image plane 508 may be positioned at f3, which is the second focus f3 of the ellipse 600.

A light beam 604 from the source 506 reflects off the collector 502A to the point/plane 508. Another light beam 606 reflects off the hyperbolic part 503B and then the elliptic part 503A of the collector 502A to the point/plane 508.

The collector systems 300, 500 collect light in a large solid angle from quasi point sources 306, 506, such as a laser produced plasma source used in extreme ultraviolet (EUV) lithography. Common key aspects of the systems 300, 500 may include:

1. A collector system 300, 500 composed of reflective surfaces 302, 304, 309 and 502, 504, 509 in both forward and backward hemispheres 320, 330 and 520, 530 around an object or light source 306 and 506.

2. Reflective surfaces 302, 304, 309 and 502, 504, 509 of the systems 300, 500 may be arranged to project light from the sources 306, 506 onto a point or a plane 308, 508 along the x-z axes.

The systems 300, 500 may have light collection subtending a solid angle greater then 2Π in lithography illumination. Each mirror may be configured and coated separately.

Using both hemispheres 320, 330, 520, 530 may achieve a larger collection angle and more collected radiation.

Figure 7:
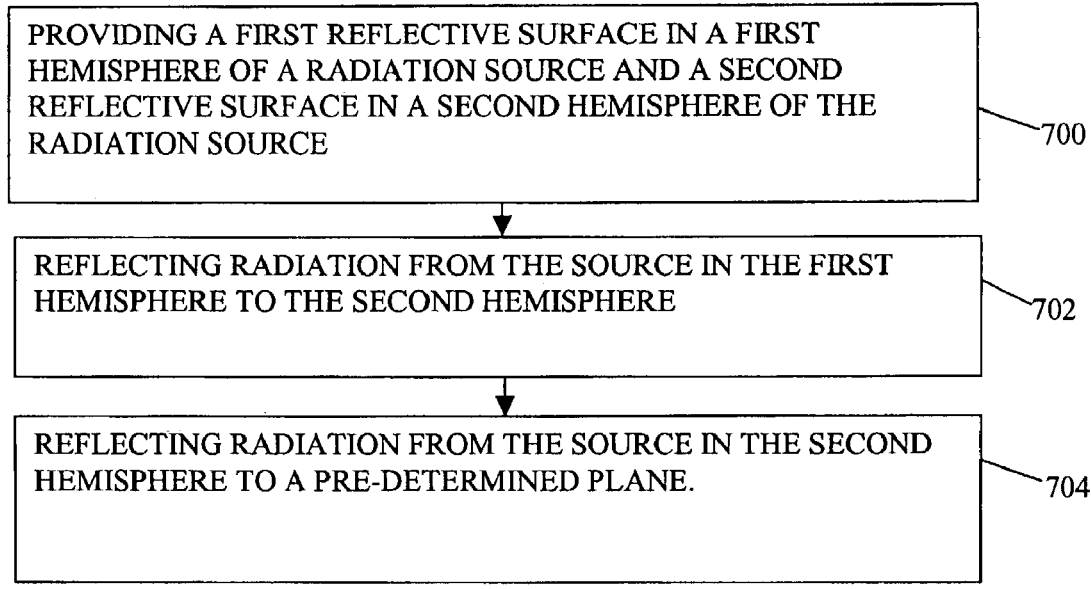
FIG. 7 illustrates a method of using a dual hemispherical collector system.

FIG. 7 illustrates a method of using a dual hemispherical collector system. The method includes providing a first reflective surface in a first hemisphere of a radiation source and a second reflective surface in a second hemisphere of the radiation source at 700; reflecting radiation from the source in the first hemisphere to the second hemisphere at 702; and reflecting radiation from the source in the second hemisphere to a pre-determined plane at 704.

A number of embodiments have been described. Nevertheless, it will be understood that various modifications may be made without departing from the spirit and scope of the application. Accordingly, other embodiments are within the scope of the following claims.

The invention claimed is:
1. An apparatus comprising:
a first surface in a first hemisphere of a radiation source, the first surface reflecting radiation from the radiation source to a second hemisphere of the radiation source; and
a second, separate surface in the second hemisphere of the source to receive radiation directly from the radiation source and reflected radiation from the first surface in the second hemisphere at grazing incidences, the second surface reflecting radiation in the second hemisphere in a forward direction from the radiation source to an output plane, wherein each of the first and the second surfaces is in a direct and full view of the radiation source without obstruction.

2. The apparatus of claim 1, wherein the source comprises an extreme ultraviolet (EUV) radiation source.

3. The apparatus of claim 1, wherein the source comprises a laser produced plasma (LPP) source.

4. The apparatus of claim 1, wherein the first surface comprises one or more mirrors.

5. The apparatus of claim 1, wherein the first surface is shaped to reflect backward radiation from the source.

6. The apparatus of claim 1, wherein the first surface is shaped as a portion of a sphere.

7. The apparatus of claim 1, wherein the first surface has an aspheric shape.

8. The apparatus of claim 1, wherein the first surface has an elliptic shape.

9. The apparatus of claim 1, wherein the first surface has a conic shape.

10. The apparatus of claim 1, wherein the first surface is positioned to receive radiation from the source at an incidence of about 75 to 89 degrees.

11. The apparatus of claim 1, wherein the first surface is configured to reflect radiation from the source through a region near the source to the second surface.

12. The apparatus of claim 1, wherein the second surface comprises at least one mirror.

13. The apparatus of claim 1, wherein the second surface has an elliptic shape.

14. The apparatus of claim 1, wherein the second surface is shaped to reflect forward radiation from the source.

15. The apparatus of claim 1, wherein the second surface is adapted to reflect radiation from the first surface to the output plane.

16. The apparatus of claim 1, wherein the second surface is configured to receive radiation from the source at an incidence or less then about 60 degrees.

17. The apparatus of claim 1, wherein the second surface comprises a first part closer to the source and a second part farther from the source, the first part being shaped as a portion of a hyperbola, the second part being shaped as a portion of an ellipse.

18. The apparatus of claim 17, wherein the hyperbola has a real focus near the radiation source and a virtual focus near a first focus of the ellipse, the ellipse having a second focus near the output plane.

19. The apparatus of claim 1, wherein the second surface comprises a set of concentric collectors, each collector having a first part closer to the source a second part farther from the source, the first part being shaped as a portion of a hyperbola, the second part being shaped as a portion of an ellipse.

20. The apparatus of claim 1, wherein the second surface comprises a set of grazing incidence collectors.

21. The apparatus of claim 1, wherein the first and second surfaces are both configured to reflect radiation to the output plane.

22. The apparatus of claim 1, wherein the first and second surfaces are configured to collect radiation from the source at a solid angle of up to about 4Π.

23. The apparatus of claim 1, wherein the source comprises a light bulb.

24. The apparatus of claim 1, wherein the apparatus is a vehicle headlight.

25. The apparatus of claim 1, wherein the apparatus is a movie projector.

26. The apparatus of claim 1, wherein the apparatus is a video projector.

27. The apparatus of claim 1, wherein the apparatus is a slide projector.

28. The apparatus of claim 1, wherein the output plane comprises an output point.

29. A lithography system comprising:
a radiation source;
a first surface shaped to reflect radiation in a first hemisphere of the radiation source to illuminate in a second hemisphere; and
a second, separate surface shaped to reflect radiation in the second hemisphere of the radiation source in a grazing incidence configuration in a forward direction from the radiation source to an output plane in the second hemisphere, wherein each of the first and the second surfaces is in a direct and full view of the radiation source without obstruction.

30. The system of claim 29, wherein the source comprises an Extreme Ultraviolet (EUV) source.

31. The system of claim 29, wherein the source comprises an Extreme Ultraviolet (EUV) laser produced plasma source.

32. The system of claim 29, further comprising optical elements positioned to direct the radiation to a predetermined pattern.

33. A method comprising:
providing a first reflective surface in a first hemisphere of a radiation source and a second, separate reflective surface in a second hemisphere of the radiation source, wherein each of the first and the second reflective surfaces is in a direct and full view of the radiation source without obstruction;
reflecting radiation from the source in the first hemisphere to the second hemisphere; and
reflecting radiation from the source in the second hemisphere in a grazing incidence configuration in a forward direction from the radiation source to an output plane.

34. The method of claim 33, further comprising generating the radiation.

35. The method of claim 33, further comprising collecting the radiation.

36. The method of claim 33, wherein the source comprises an electric discharge extreme ultraviolet source.

37. The method of claim 33, wherein the source comprises a dense plasma focus (DPF) electric discharge extreme ultraviolet source.

38. The method of claim 33, wherein the source comprises a laser produced plasma (LPP) source.

39. A device, comprising:
a radiation source radiating radiation into first and second hemispheres;
a first curved reflector located in the first hemisphere to receive radiation directly from the radiation source in a near normal incidence configuration and to reflect received radiation to the second hemisphere; and
a second, separate curved reflector located in the second hemisphere to receive radiation directly from the radiation source in a grazing incidence configuration and to reflect radiation in the second hemisphere in a forward direction from the radiation source to an output plane in the second hemisphere, wherein each of the first and the second curved reflectors is in a direct and full view of the radiation source without obstruction.

40. The device as in claim 39, wherein the radiation source is an extreme ultraviolet (EUV) source.

* * * * *